United States Patent [19]
Iwata et al.

[11] Patent Number: 5,249,414
[45] Date of Patent: Oct. 5, 1993

[54] YARN FOR USE IN SET UP

[75] Inventors: Kenji Iwata; Katsumi Asano, both of Wakayama, Japan

[73] Assignees: Nissinbo Industries, Inc., Tokyo; Shima Seiki Mfg., Ltd., Wakayama, both of Japan

[21] Appl. No.: 806,793

[22] Filed: Dec. 12, 1991

Related U.S. Application Data

[63] Continuation of Ser. No. 549,943, Jul. 9, 1990, abandoned.

[51] Int. Cl.$^5$ .......................... D02G 3/36; D02G 3/02
[52] U.S. Cl. ........................................ 57/225; 57/210; 57/211; 57/226; 57/227
[58] Field of Search ............... 57/210.1, 224–227, 57/236, 238, 210, 211

[56] References Cited

U.S. PATENT DOCUMENTS

| | | | |
|---|---|---|---|
| 1,006,014 | 10/1911 | Sondley | 57/225 X |
| 2,057,577 | 10/1936 | Kennedy | 57/211 |
| 2,076,272 | 4/1937 | Harris | 57/211 |
| 2,387,320 | 10/1945 | Foster | 57/210 X |
| 3,301,017 | 1/1967 | Bird et al. | 57/210 X |
| 3,380,244 | 4/1968 | Martin | 57/226 |
| 3,412,547 | 11/1968 | Martin | 57/226 |
| 3,625,809 | 12/1971 | Caroselli et al. | 57/229 X |
| 4,356,690 | 11/1982 | Minorikawa et al. | 57/210 |
| 4,760,690 | 8/1988 | Lang et al. | 57/902 X |

FOREIGN PATENT DOCUMENTS 1421686 11/1965 France.

Primary Examiner—Daniel P. Stodola
Assistant Examiner—William Stryjewski

[57] ABSTRACT

The object is to provide a yarn for use in setup, which allows knitted goods to be manufactured by weft knitting machines in such a manner that the yarn does not break or slip out of the knitting needles but forms regular stitches. The yarn for use in setup comprises an elastic yarn and fiber bundles with which the elastic yarn is covered or an elastic yarn and fiber bundles, which are twisted, each of the fiber bundles consisting of highly abrasion-resistant fibers having tensile strength.

8 Claims, 2 Drawing Sheets

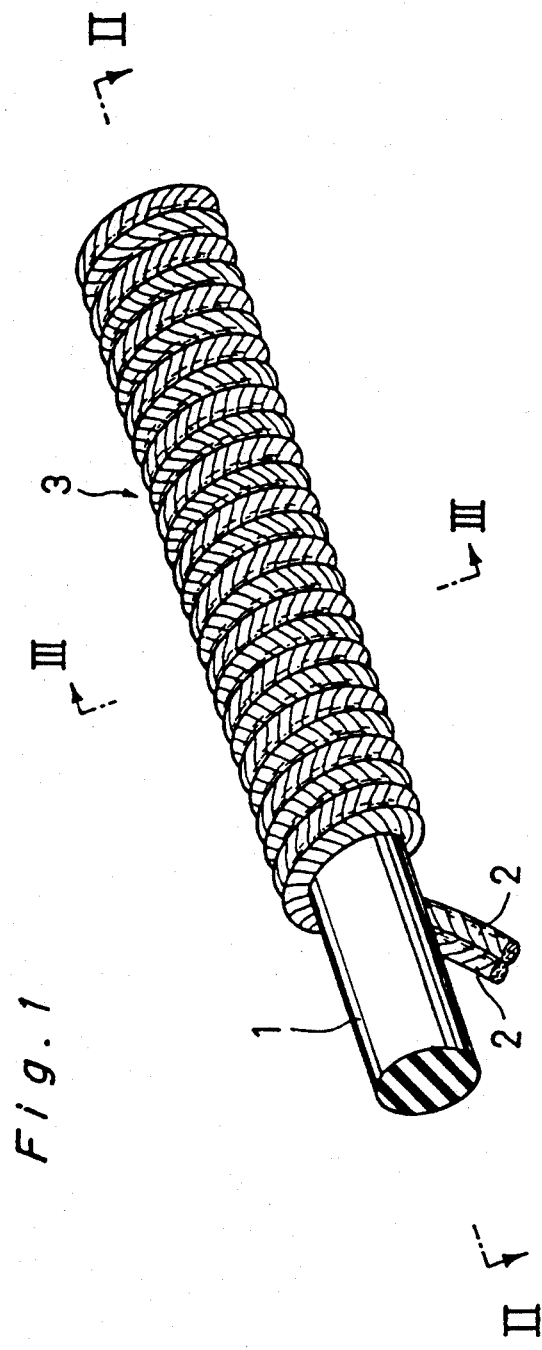
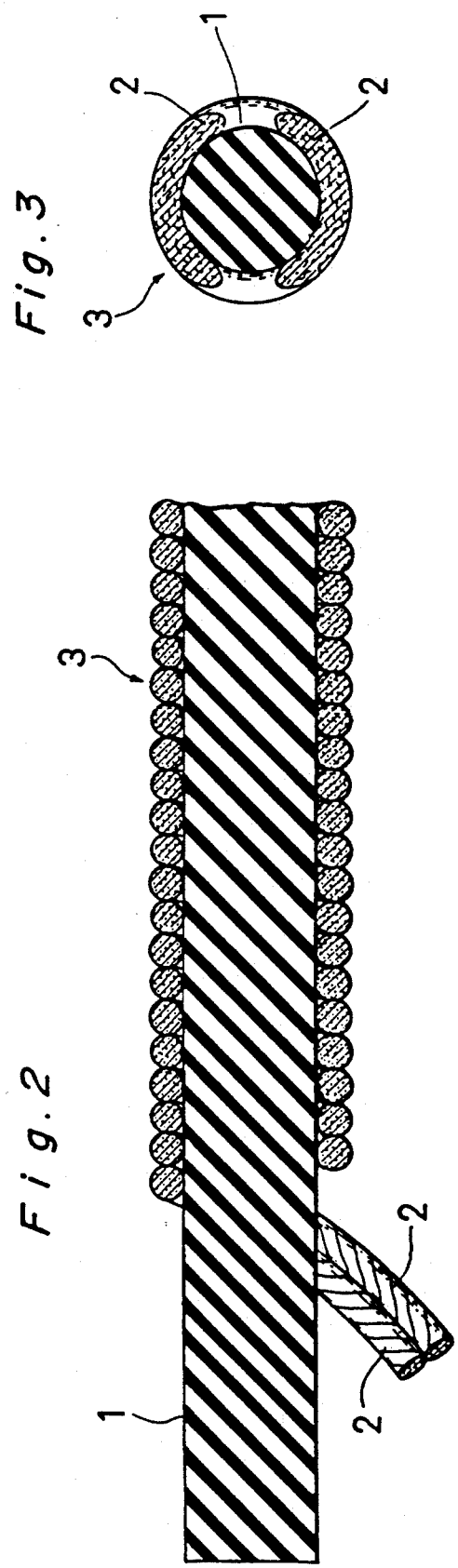

YARN FOR USE IN SET UP

This application is a continuation of application Ser. No. 07/549,943 filed on Jul. 9, 1990, now abandoned.

BACKGROUND OF THE INVENTION

1. Field of the Invention

The present invention relates to a yarn for use in setup in a weft knitting machine. The yarn in accordance with the present invention is especially useful when setup is required for each garment.

2. Description of Related Art

Two methods of weft knitting are known. One of them is a continuous method in which one garment is connected to another by means of a raveling cord or the like. In the other of the known methods, a single garment constitutes a batch of knitting.

A significant feature of the continuous method is predicated on the point that it is only at the time of beginning to knit a first garment that stitches are formed by means of a yarn for use in setup.

The advantage offered by this method consists in the point that, even if the first garment is defectively knitted, the second and the succeeding garments can be of excellent fabrics.

The other of the known methods, in which each garment constitutes a unit of weft knitting, is suited for a flexible manufacturing system to cope with diversified demands for knitted goods, and is in the limelight from the standpoint of resource-saving and labor-saving efforts and in view of the fact that knitters are studying the ways of adding more value to their goods and using high-grade materials such as wool.

At each time of beginning to knit a garment by the latter method, stitches are formed by means of a yarn for use in setup. Suitable tension is exerted on them while knitting proceeds. This method can remove of the losses which have so far been arising out of the cutting process and have mounted to 20 to 30 percent even under normal conditions. Thus, this method provides an efficient means for making full use of the fabrics.

Unlike the continuous method, the latter method does not include a waste course and obviates the necessity of providing a process for disposing of waste products.

Furthermore, the latter method allows a knitting process and a sewing process to be directly connected to each other in a production line, because a single garment constitutes a batch of knitting. Thus, this method improves production efficiency and the reduces of time required for knitting.

In either of the above-described known methods, machine sewing thread made of polyester or nylon fibers, or acrylic waste yarn is commonly used for setup.

From the standpoints of abrasion resistance, tensile strength and elasticity, however, the above-mentioned machine sewing thread and waste yarn are far from satisfactory for use in setup. Machine sewing thread is in want of elasticity, although it has mechanical strength. Waste yarn is in want of mechanical strength, although it has elasticity to some extent.

Knitting needles slightly vibrate and machine sewing thread or waste yarn used for setup undergoes tension while knitting proceeds. Therefore, when machine sewing thread having little elasticity or waste yarn having insufficient mechanical strength is used for setup, this tension makes the waste yarn susceptible to breakage, while the machine sewing thread, which is in went of elasticity, is apt to slip out of the knitting needles.

Consequently, knitted goods are apt to have irregular stitches.

These problems are especially serious in the second one of the above-described known methods, because that method is accompanied by high frequency in use of the yarn for setup.

SUMMARY OF THE INVENTION

It is an object of the present invention to provide a yarn for use in setup, which allows knitted goods to be manufactured by a weft knitting machine in such a manner that the yarn does not break or slip out of the knitting needles but forms regular stitches.

In accordance with the present invention, a yarn for use in setup comprises an elastic yarn and fiber bundles with which the elastic yarn is covered or an elastic yarn and fiber bundles, which are twisted, each of the fiber bundles consisting of highly abrasion-resistant fibers having great tensile strength.

Other and further details of the present invention are hereinafter described with reference to the accompanying drawings.

BRIEF DESCRIPTION OF THE DRAWINGS

FIG. 1 is a perspective view of a yarn for use in setup in accordance with the present invention;

FIG. 2 is a longitudinal section thereof;

FIG. 3 is a transverse cross section thereof;

DESCRIPTION OF THE PREFERRED EMBODIMENTS

In a first embodiment of the invention, the yarn for use in setup comprises an elastic yarn and fiber bundles with which the elastic yarn is covered or an elastic yarn and fiber bundles, which are twisted, each of the fiber bundles consisting of highly abrasion-resistant fibers having great tensile strength.

This yarn for use in setup has elasticity because of the elastic yarn covered with the fiber bundles, and has mechanical strength because of the fiber bundles. These elasticity and mechanical strength characteristics are great enough to resist tension and frictional force to which the yarn is subjected while knitting proceeds. Thus the yarn hardly breaks or slips out of the knitting needles or forms irregular stitches.

In a second embodiment of the invention, the yarn for use in setup comprises a plurality of the above-mentioned yarns twisted, and each of the yarns consists of an elastic yarn and fiber bundles with which the elastic yarn is covered or an elastic yarn and fiber bundles, which are twisted, the fiber bundles in turn consisting of highly abrasion-resistant fibers having great tensile strength.

In this embodiment, mechanical strength is so enhanced by a plurality of the yarns twisted that the yarn hardly breaks.

DETAILED DESCRIPTION OF PREFERRED EMBODIMENTS

FIG. 1 shows an example of the yarn for use in setup in accordance with the present invention. FIG. 2 is a longitudinal section thereof, while FIG. 3 is a transverse cross section thereof.

Referring now to FIG. 1, the yarn for use in setup is denoted generally by the numeral 3. The yarn 3 comprises an elastic yarn 1 and two fiber bundles 2. The elastic yarn 1, which is of a round cross-section, and the fiber bundles 2 with which the elastic yarn 1 is covered. Alternatively, the fiber bundles 2 are twisted with the elastic yarn 1.

The elastic yarn 1 is made of a highly elastic material such as polyurethane or rubber, while the fiber bundles 2 consist of highly abrasion-resistant fibers having great tensile strength. Preferably, they are made of polyester, nylon, vinylon, acrylic fibers or the like.

An S twist is given to one of the two fiber bundles 2, while a Z twist is given to the other. The result is that, even if they relax, they remain conforming closely to the surface of the elastic yarn 1 and, even if they are twisted excessively, breakage of fibers does not occur.

Figure 4:
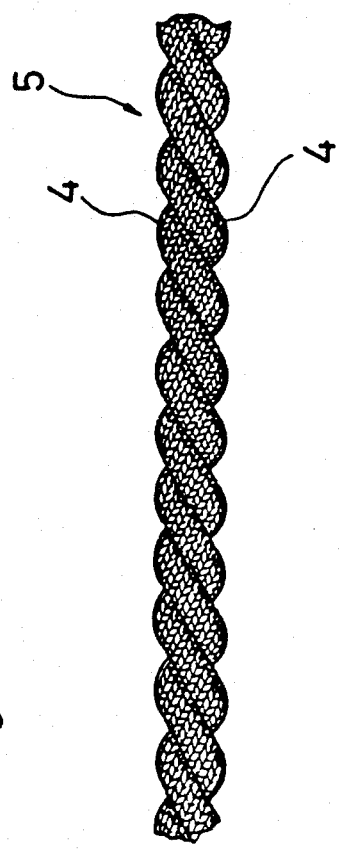
FIG. 4 is a front view of yarns twisted thereof.
Figure 5:
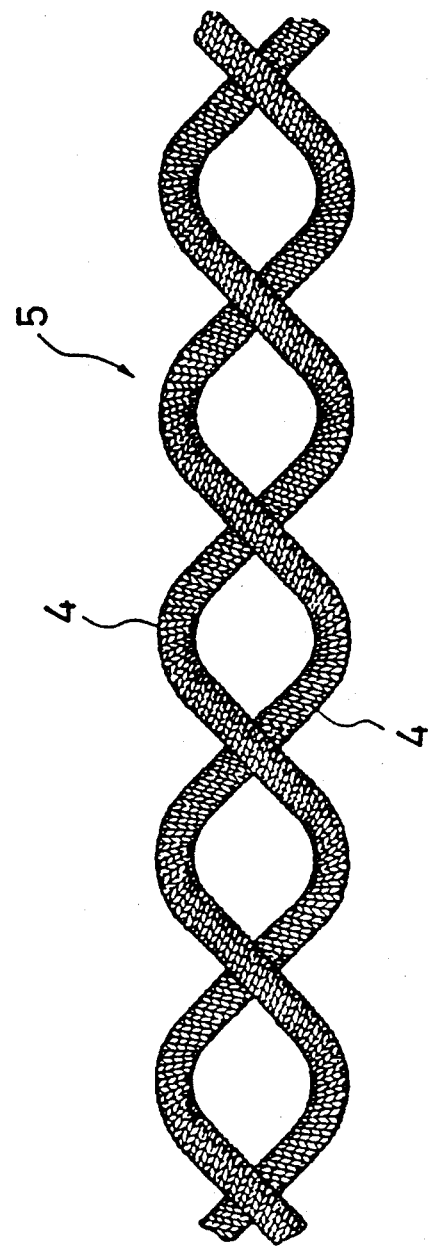
FIG. 5 is a front view, illustrating the unraveled condition thereof.

FIG. 4 shows another example of the yarn for use in setup in accordance with the present invention, and FIG. 5 shows an unraveled condition thereof.

Referring now to FIG. 4, the yarn for use in setup is denoted generally by the numeral 5. The yarn 5 comprises two yarns 4 twisted, and each of the yarns 4 is the same as the yarn 3 shown in FIG. 1. In other words, each of the yarns 4 comprises an elastic yarn 1 and two fiber bundles 2.

It is preferable to twist two yarns 4 while untwisting each of them. Such yarns 4 will enhance the elasticity of the yarn 5 and ensure more reliably that yarn breakage will not occur.

While this invention has been described particularly in connection with the case where two fiber bundles are used, it is to be understood that this was merely given as a preferred embodiment of the invention and is not to be deemed limitative of the same. A suitable number of fiber bundles may be used in due consideration of the mechanical strength of the material used. This holds good for the number of the yarns as well.

What is claimed is:

1. A yarn for use in setup comprising:
   a pair of twisted composite yarn strands, each of said composite yarn strands including
   an elastic yarn, and
   a pair of twisted fiber bundles wrapped in parallel around said elastic yarn in a single layer, a first one of said pair of twisted fiber bundles being pre-twisted in a S-direction, and a second one of said pair of twisted fiber bundles being pre-twisted in an opposing Z-direction, thereby forming said composite yarn which composite yarn is resistant to twisting and whose fiber bundles remain in close contact with said elastic yarn.

2. The composite yarn according to claim 1, wherein said elastic yarn is made of polyurethane.

3. The composite yarn according to claim 1, wherein said elastic yarn is made of rubber.

4. The composite yarn according to claim 1, wherein said pair of twisted fiber bundles are made of polyester fibers.

5. A yarn for use in setup comprising:
   a plurality of twisted composite yarn strands, each of said composite yarn strands including
   an elastic yarn, and
   a pair of twisted fiber bundles wrapped in parallel around said elastic yarn in a single layer, a first one of said pair of twisted fiber bundles being pre-twisted in an S-direction, and a second one of said pair of twisted fiber bundles being pre-twisted in an opposing Z-direction wherein the fiber bundles remain in close contact with said elastic yarn.

6. The composite yarn according to claim 5, wherein said elastic yarn is made of polyurethane.

7. The composite yarn according to claim 5, wherein said elastic yarn is made of rubber.

8. The composite yarn according to claim 5, wherein said pair of twisted fiber bundles are made of polyester fibers.

* * * * *